(12) United States Patent
Son et al.

(10) Patent No.: US 9,123,396 B2
(45) Date of Patent: Sep. 1, 2015

(54) SEMICONDUCTOR APPARATUS

(71) Applicant: SK HYNIX INC., Icheon (KR)

(72) Inventors: Chang Man Son, Icheon (KR); Chang Hyuk Lee, Seongnam (KR); Go Hyun Lee, Yongin (KR); Kwang Ho Baek, Hwaseong (KR)

(73) Assignee: SK HYNIX INC., Icheon (KR)

( * ) Notice: Subject to any disclaimer, the term of this patent is extended or adjusted under 35 U.S.C. 154(b) by 3 days.

(21) Appl. No.: 13/960,398

(22) Filed: Aug. 6, 2013

(65) Prior Publication Data

US 2014/0313809 A1 Oct. 23, 2014

(30) Foreign Application Priority Data

Apr. 23, 2013 (KR) .......................... 10-2013-0044742

(51) Int. Cl.
*G11C 5/06* (2006.01)
*G11C 8/10* (2006.01)

(52) U.S. Cl.
CPC ........................................ *G11C 8/10* (2013.01)

(58) Field of Classification Search
CPC ...... G11C 5/063; G11C 7/19; G11C 11/4097; G11C 7/18
USPC .................................. 365/63, 185.11, 230.03
See application file for complete search history.

(56) References Cited

U.S. PATENT DOCUMENTS

2011/0149629 A1* 6/2011 Shim et al. ...................... 365/63

FOREIGN PATENT DOCUMENTS

KR 10-2009-0075062 A 7/2009

* cited by examiner

*Primary Examiner* — Huan Hoang

(57) ABSTRACT

A semiconductor device may include first conductive patterns coupled to a common source and selection lines of a memory block formed at a substrate, second conductive patterns configured to form a bit line coupled to the memory block, and third conductive patterns configured to transmit a block selection signal to couple local lines of the memory block to global lines. The first to third conductive patterns are arranged in different layers over the memory block.

19 Claims, 18 Drawing Sheets

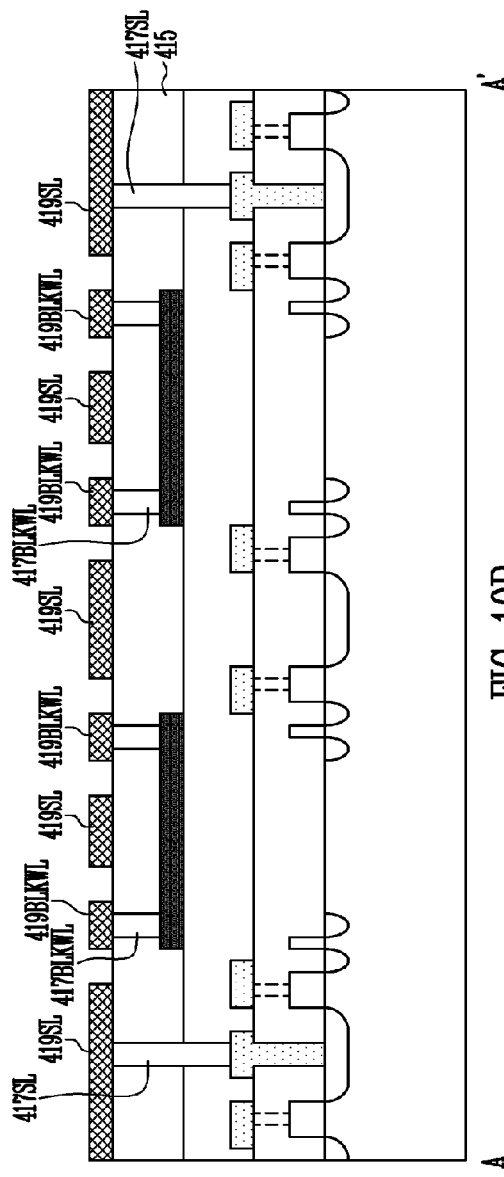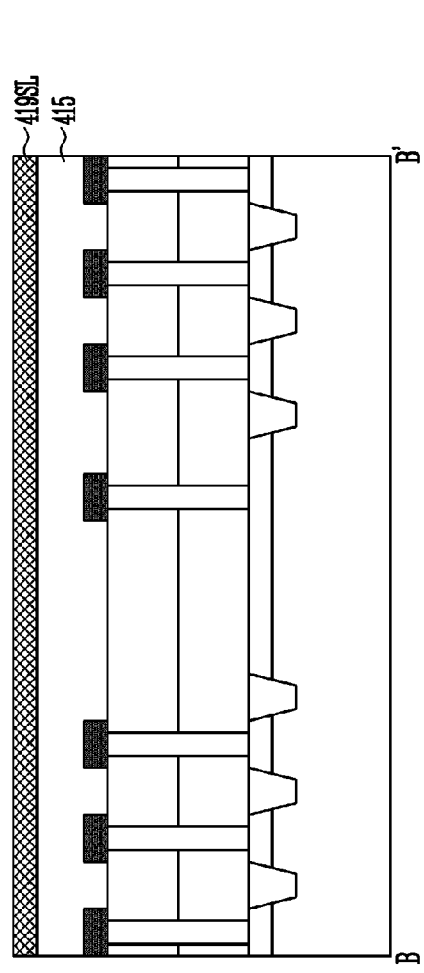

SEMICONDUCTOR APPARATUS

CROSS-REFERENCE TO RELATED APPLICATION

The present application claims priority to Korean patent application number 10-2013-0044742 filed on Apr. 23, 2013, in the Korean Intellectual Property Office, the entire disclosure of which is incorporated by reference herein.

BACKGROUND

1. Technical Field

Various embodiments relate to an electronic apparatus and, more particularly, to a semiconductor apparatus.

2. Related Art

For a semiconductor apparatus, a memory array may include two planes, and each of the planes may include a plurality of memory blocks.

On one side of a first plane, there may be provided a first switching circuit group configured to selectively couple first global lines to local lines of the memory blocks included in the first plane. On a side of a second plane that is symmetrically opposed to the one side of the first plane, there may be provided a second switching circuit group configured to selectively couple second global lines to local lines of the memory blocks included in the second plane.

The first and second switching circuit groups operate in response to block selection signals output from a row decoder. The row decoder is disposed adjacent to the first switching circuit group or the second switching circuit group. When the row decoder is disposed adjacent to the first switching circuit group, in order to transmit the block selection signals from the row decoder to the second switching circuit group (not adjacent to the row decoder), a plurality of wires pass over the memory blocks between the two switching circuit groups. In such wiring, it is difficult to arrange other wires (such as drain selection line wires, source selection line wires, etc.) Moreover, since areas in which the other wires can be arranged are reduced, cross-sections of the other wires become smaller and resistance values of the other wires increases. And, since intervals between two wires become narrower, a risk of shorting between the wires also increases.

BRIEF SUMMARY

Various embodiments relate to a semiconductor apparatus.

A semiconductor apparatus according to an embodiment may include first conductive patterns coupled to a common source and selection lines of a memory block formed at a substrate, second conductive patterns configured to form a bit line coupled to the memory block and third conductive patterns configured to transmit a block selection signal to couple local lines of the memory block to global lines, wherein the first to third conductive patterns are arranged on different layers over the memory block.

A semiconductor apparatus according to another embodiment may include first and second memory blocks arranged in a first direction, first and second switching circuits, the first switching circuit located on one side of the first memory block and configured to couple local lines of the first memory block to first global lines in response to a block selection signal, and the second switching circuit located on a side, symmetrically opposite to the one side of the first memory block, of the second memory block and configured to couple local lines of the second memory block to second global lines in response to a block selection signal, first and second read/write circuits, the first read/write circuit coupled to the first memory block through first bit lines and the second read/write circuit coupled to the second memory block through second bit lines, and a row decoder configured to generate the block selection signal applied to the first and second switching circuits, and a wire transmitting the block selection signal and arranged over the first and second bit lines.

BRIEF DESCRIPTION OF THE DRAWINGS

Embodiments of the present disclosure will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the present disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 16A, 16B, 17A, 17B, 18A, 18B, 19A and 19B are cross-sectional views illustrating the semiconductor apparatus and the method of manufacturing the same according to an embodiment.

DETAILED DESCRIPTION

Hereinafter, various embodiments will be described in detail with reference to the accompanying drawings. The figures are provided to allow those having ordinary skill in the art to understand the scope of these embodiments of the disclosure. Embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

Figure 1:
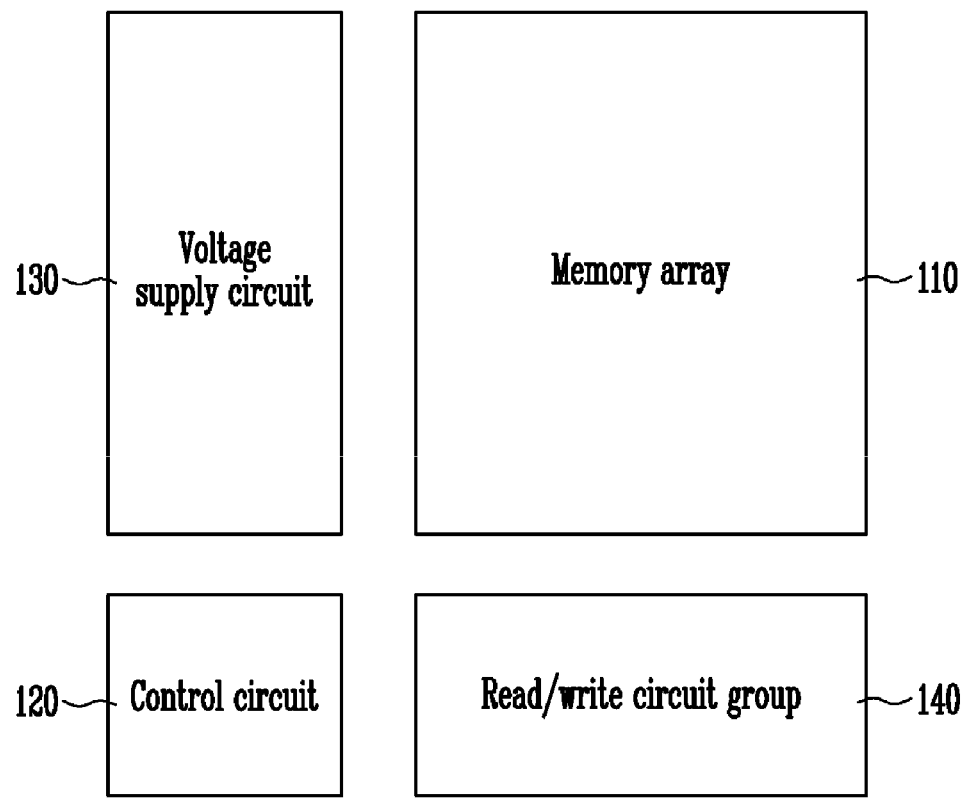
FIG. 1 is a block diagram illustrating a semiconductor apparatus according to an embodiment.
Figure 2:
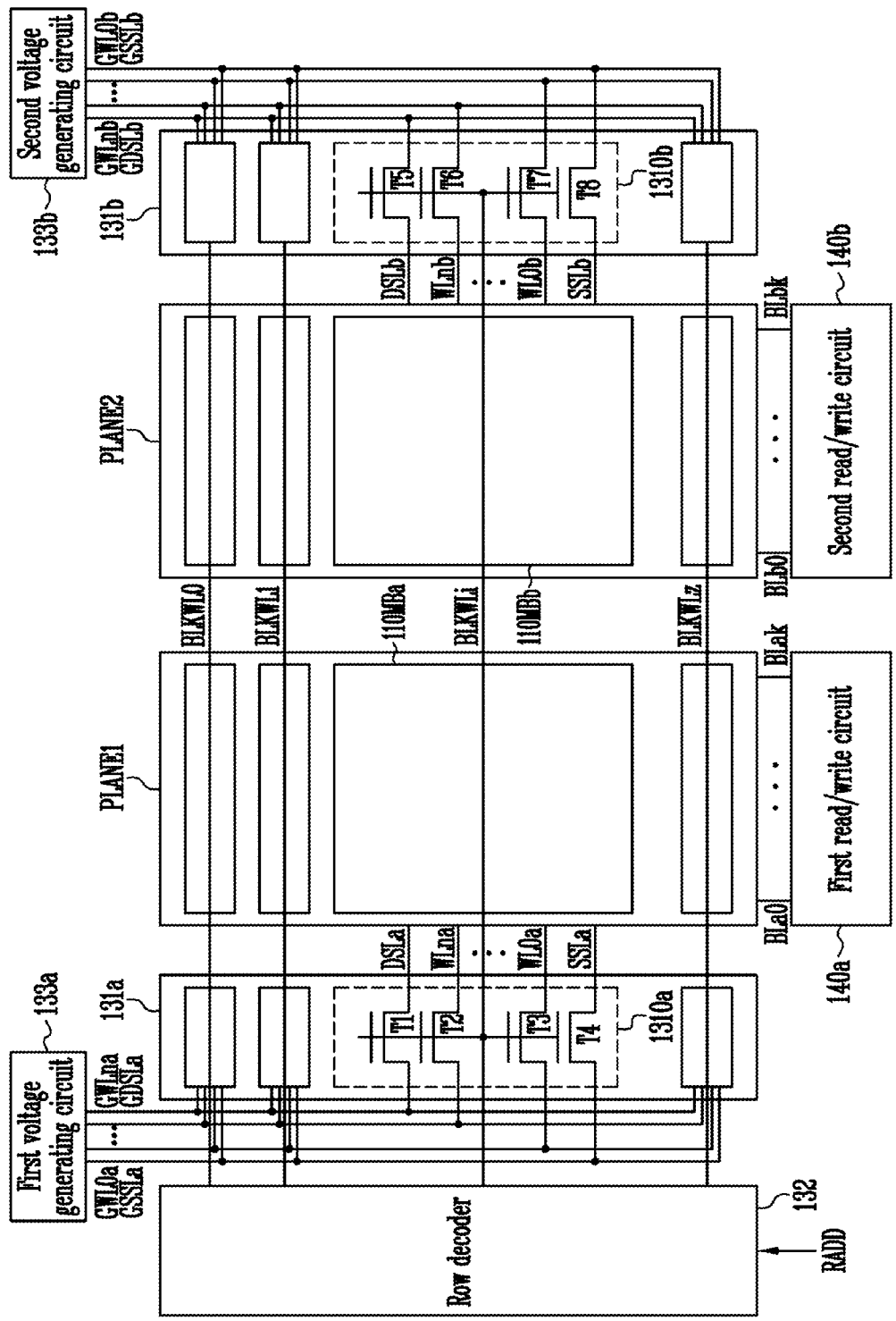
FIG. 2 is a block diagram illustrating in detail the semiconductor apparatus according to the embodiment shown in FIG. 1.

FIG. 1 is a block diagram illustrating a semiconductor apparatus according to an embodiment. FIG. 2 is a block diagram illustrating in detail the semiconductor apparatus according to the embodiment shown in FIG. 1.

Referring to FIGS. 1 and 2, the semiconductor apparatus includes a memory array 110 and peripheral circuits 120 to 140. For example, the peripheral circuits include a control circuit 120 and operation circuits 130 and 140.

In an embodiment, the memory array 110 may include two planes PLANE1 and PLANE2. Each of the planes includes a plurality of memory blocks 110MBa and 110MBb. The two planes PLANE1 and PLANE2 may be arranged adjacent to each other, so that the memory blocks 110MBa in the first plane PLANE1 and the memory blocks 110 MBb in the second plane PLANE2 will also be adjacent to each other. Each of the memory blocks 110MBa and 110MBb may include a plurality of memory strings ST (see FIG. 3). The structure of the memory blocks 110MBa will be described in the following paragraphs with reference to FIG. 3.

Figure 3:
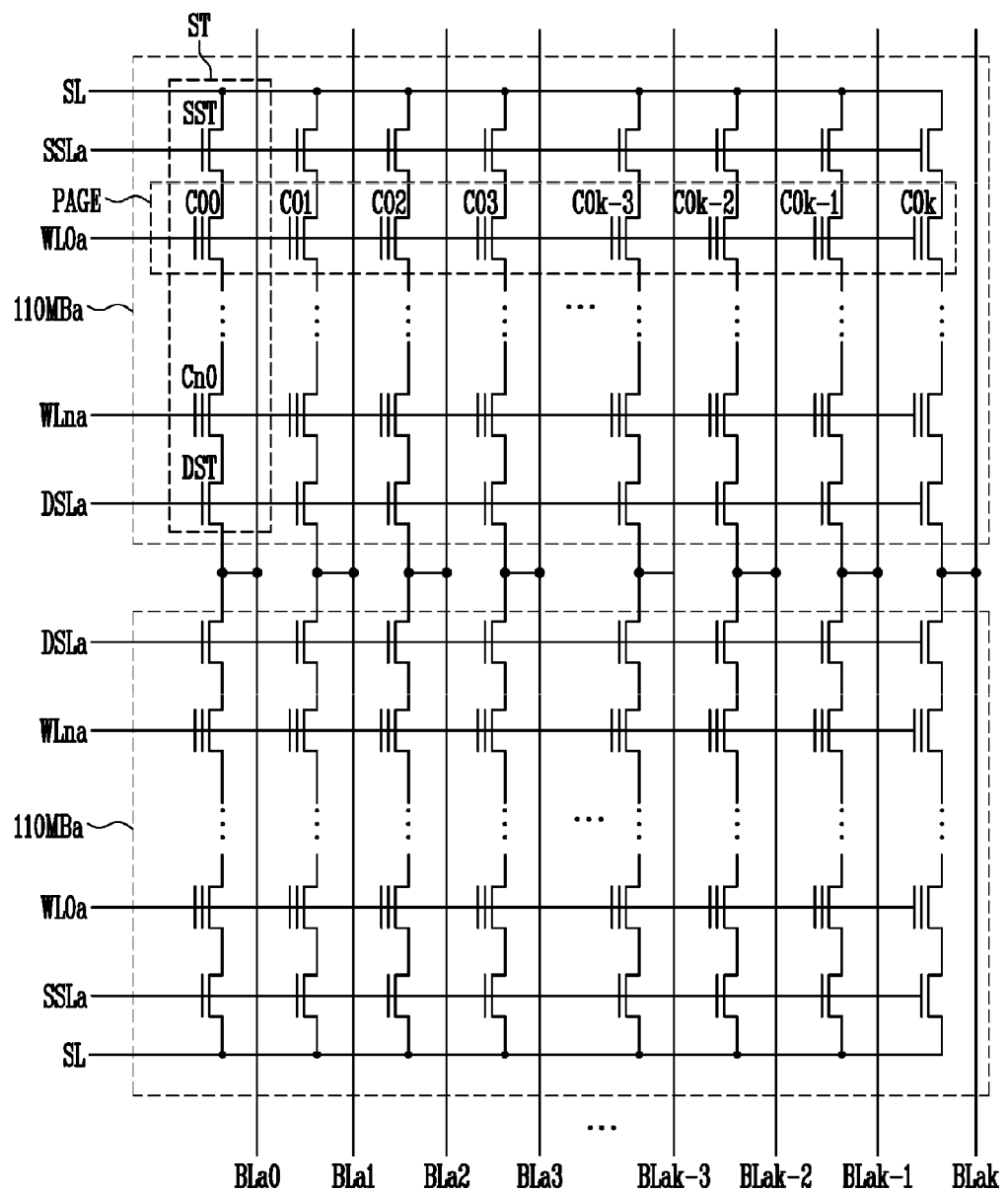
FIG. 3 is a circuit diagram illustrating memory blocks shown in FIG. 2.

FIG. 3 is a circuit diagram illustrating the memory blocks 110MBa shown in FIG. 2.

Referring to FIG. 3, each of the memory blocks 110MBa includes a plurality of memory strings ST coupled between bit lines BLa0-BLak, and common source lines SL. Each of the memory strings ST is coupled to a corresponding bit line among the bit lines BLa0-BLak and a corresponding common source line SL. For example, as shown in FIG. 3, one of the memory strings ST may include a source selection transistor SST (whose source is coupled to the common source line SL), a cell string in which a plurality of memory cells C00-Cn0 are coupled in series, and a drain selection transistor DST (whose drain is coupled to the bit line BLa0). The memory cells C00-Cn0 in the cell string are coupled in series between the selection transistors SST and DST. A gate of the source selection transistor SST is coupled to a source selection line SSLa. Gates of the memory cells C00-Cn0 are coupled to word lines WL0a-WLna, respectively. A gate of the drain selection transistor DST is coupled to a drain selection line DSLa.

The drain selection transistor DST controls coupling or not coupling the cell string C00-Cn0 and the bit line BLa0. The source selection transistor SST controls coupling or not coupling the cell string C00-Cn0 and the common source line SL.

The memory cells in the memory cell blocks in a NAND flash memory apparatus may include a number of physical pages or logical pages. A physical page includes the memory cells C00-C0k coupled to one word line (e.g., WL0). Furthermore, an even-numbered physical page and an odd-numbered physical page include even-numbered memory cells and odd-numbered memory cells coupled to one word line (e.g., WL0a), respectively. Such a page (e.g., even-numbered physical page or odd-numbered physical page) becomes a basic unit in a program operation or a read operation.

Referring to FIGS. 1 to 3, the peripheral circuits 120 to 140 are configured to perform erase, program, and read operations of the memory cells in the memory blocks 110MBa. Such peripheral circuits include operation circuits 130 and 140 configured to perform the erase, program, and read operations in response to control signals outputted from a control circuit 120. In order to perform the erase, program, and read operations, the operation circuits 130 and 140 are configured to selectively output operation voltages to local lines SSLa, WL0a-WLna, DSLa, and SL of the selected memory block and control precharge/discharge of the bit lines BLa0 to BLak. For example, in a read operation, high voltages are applied to word lines (e.g., word lines WL1a to WLna) coupled to unselected memory cells in a memory string ST and a reading voltage is applied to a selected word line (e.g., word line WL0a) coupled to a selected memory cell in the memory string ST. The high voltages turn on cell transistors in the unselected memory cells, and the reading voltage turns on or off a cell transistor in the selected memory cell depending on whether the selected memory cell stores a logic high or low data. When the selected cell transistor turns on, a current flows through a corresponding bit line (e.g., BLa0) among the bit lines BLa0-BLak.

For example, in the NAND flash memory apparatus, the operation circuits may include a voltage supply circuit 130 and a read/write circuit group 140. Operations of each circuit will be explained in detail in the following paragraphs.

The control circuit 120 controls the voltage supply circuit 130 such that the voltage supply circuit 130 generates operation voltages having desired levels for the erase, program, and read operations and outputs the operation voltages to the local lines of a selected memory block. Also, the control circuit 120 controls the read/write circuit group 140 to perform the erase, program, and read operations.

In an embodiment, the voltage supply circuit 130 may include a first switching circuit group 131a, a second switching circuit group 131b, a row decoder 132, a first voltage generating circuit 133a and a second voltage generating circuit 133b.

The first switching circuit group 131a may include first switching circuits 1310a configured to selectively couple first global lines GSSLa, GWL0a-GWLna, and GDSLa of the first plane PLANE1 to the local lines SSLa, WL0a-WLna, and DSLa of the memory blocks 110MBa in response to block selection signals BLKWL0-BLKWLz. The first switching circuit 1310a is arranged on one side of the memory block 110MBa.

The second switching circuit group 131b may include second switching circuits 1310b configured to selectively couple second global lines GSSLb, GWL0b-GWLnb, and GDSLb of the second plane PLANE2 to the local lines SSLb, WL0b-WLnb, and DSLb of the memory blocks 110MBb in response to the block selection signals BLKWL0-BLKWLz. The second switching circuit 1310b is arranged on a side of the memory block 110MBb that is symmetrically opposed to the one side of the memory block 110MBa.

The row decoder 132 outputs the block selection signals BLKWL0-BLKWLz to the first and second switching circuit groups 131a and 131b in response to a row address signal RADD outputted from the control circuit 120. Each of the block selection signals BLKWLi is simultaneously supplied through a wire (or block selection signal wire) to the first switching circuit 1310a of the first switching circuit group 131a and the second switching circuit 1310b of the second switching circuit group 131b. The wire to transmit the block selection signal BLKWLi passes over the memory blocks 110MBa and 110MBb.

The first voltage generating circuit 133a outputs operation voltages for an erase, program or read operation of the memory block 110MBa to the first global lines GSSLa, GWL0a-GWLna, and GDSLa. The memory block 110MBa is selected from a plurality of memory blocks in the first plane PLANE1 by the first switching circuit group 131a in response to the block selection signals BLKWL0-BLKWLz. As a result, the operation voltages outputted to the first global lines GSSLa, GWL0a-GWLna, and GDSLa are transmitted to the local lines SSLa, WL0a-WLna, and DSLa of the selected memory block 110MBa.

The second voltage generating circuit 133b outputs the operation voltages for the erase, program, or read operation of the memory block 110MBb to the second global lines GSSLb, GWL0b-GWLnb and GDSLb. The memory block 110MBb is selected from a plurality of memory blocks in the second plane PLANE2 by the second switching circuit group 131b in response to the block selection signals BLKWL0-BLKWLz. As a result, the operation voltages outputted to the second global lines GSSLb, GWL0b-GWLnb and GDSLb are transmitted to the local lines SSLb, WL0b-WLnb and DSLb of the selected memory block 110MBb.

In an embodiment, the read/write circuit group 140 includes a first read/write circuit 140a and a second read/write circuit 140b.

The first read/write circuit 140a may include a plurality of page buffers coupled to the memory blocks 110MBa of the first plane PLANE1 through the first bit lines BLa0-BLak. The first read/write circuit 140a selectively pre-charges the first bit lines BLa0-BLak according to data to be stored into memory cells in the memory blocks 110MBa during a program operation. The first read/write circuit 140a may latch the data read from the memory cell by sensing a change in voltage or current levels of the first bit lines BLa0-BLak after pre-charging the first bit lines BLa0-BLak during a program verification operation or read operation.

The second read/write circuit 140b may include a plurality of page buffers coupled to the memory blocks 110MBb of the second plane PLANE2 through the second bit lines BLb0-BLbk. The second read/write circuit 140b selectively pre-charges the second bit lines BLb0-BLbk according to data to be stored into memory cells in the memory blocks 110MBb during the program operation. The second read/write circuit 140b may latch the data read from the memory cell by sensing a change in voltage or current levels of the second bit lines BLb0-BLbk after pre-charging the second bit lines BLb0-BLbk during the program verification operation or read operation.

In the semiconductor apparatus as described above, in order to transmit a block selection signal BLKWLi to the second switching circuit 1310b from the row decoder 132, the block selection signal wire passes over the memory blocks 110MBa and 110MBb. Other wires may be placed in addition to the block selection signal wire over the memory blocks 110MBa and 110MBb. In certain embodiments, the other wires and the block selection signal wire are arranged on different planes at different levels from a substrate of the semiconductor apparatus. As a result, electrical characteristics (e.g., resistance values) of the other wires may be improved, and/or a risk of a short in wiring may be reduced. This will be explained in detail in the following paragraphs.

FIGS. 4 to 7 are planar views illustrating the semiconductor apparatus according to an embodiment. FIGS. 8A, 8B, 9A, 9B, 10A, 10B, 11A and 11B are cross-sectional views illustrating the semiconductor apparatus and the method of manufacturing the same according to the embodiment shown in FIGS. 4 to 7.

Figure 4:
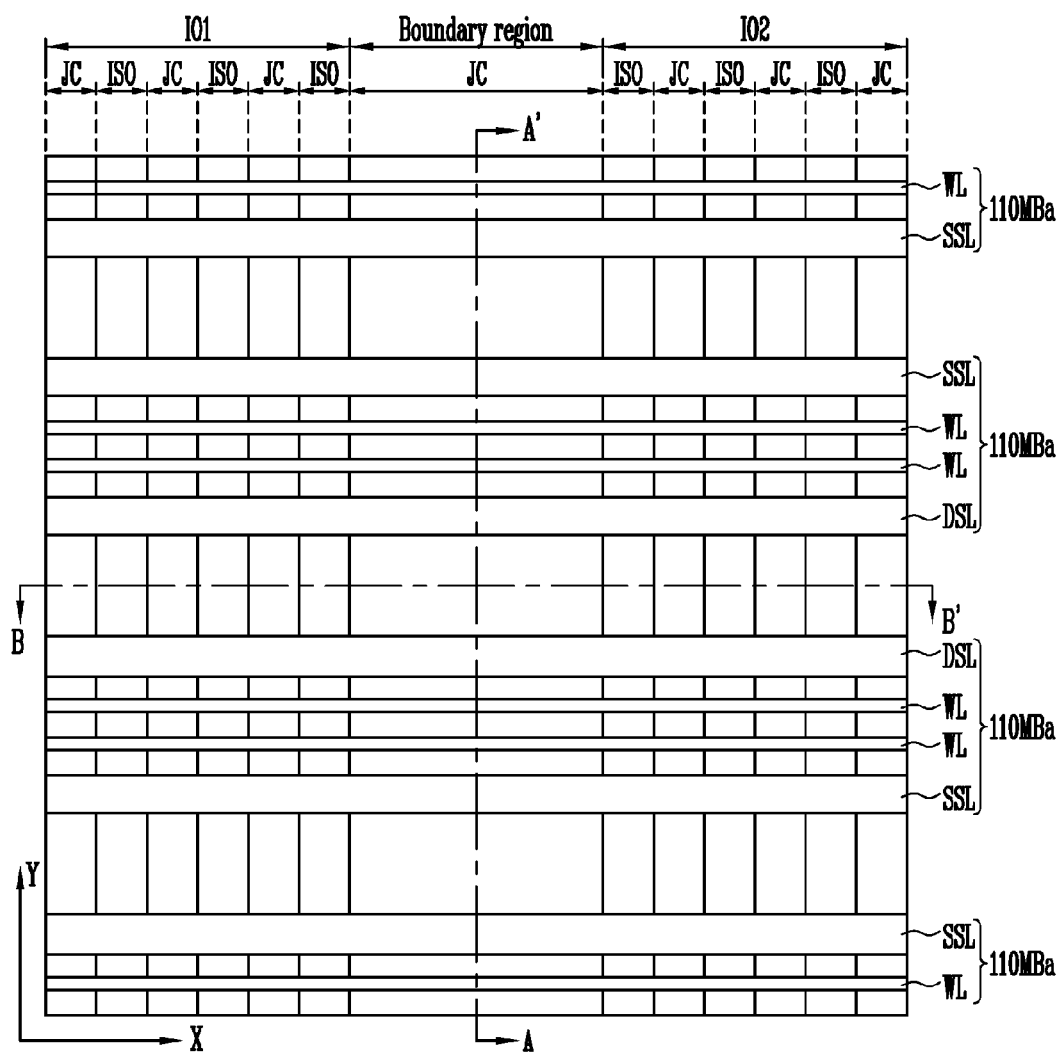
FIGS. 4 to 7 are planar views illustrating the semiconductor apparatus according to an embodiment.
Figure 8A:
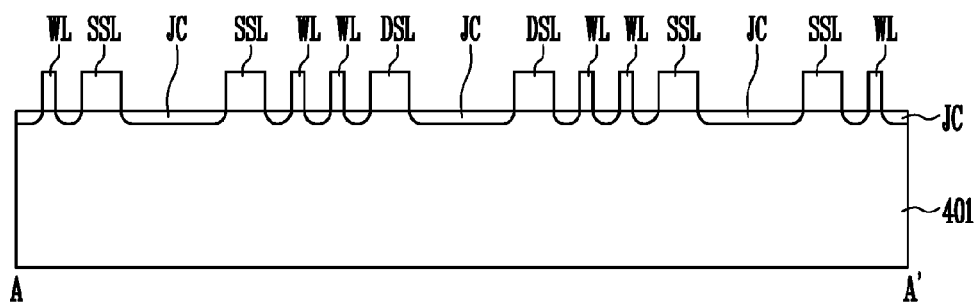
FIGS. 8A, 8B, 9A, 9B, 10A, 10B, 11A and 11B are cross-sectional views illustrating the semiconductor apparatus and the method of manufacturing the same according to an embodiment.
Figure 8B:
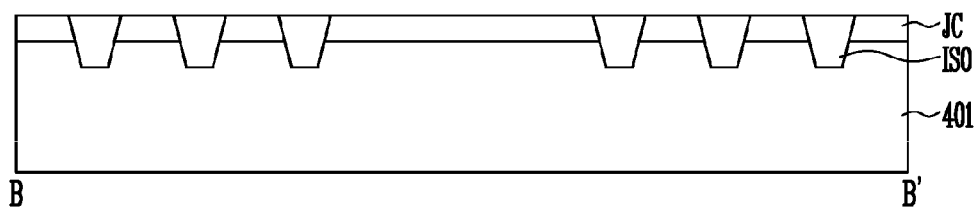

Referring to FIGS. 4, 8A and 8B, the memory blocks 110MBa are formed in a memory array region of a semiconductor substrate 401. For convenience, only some of the memory blocks in a plane, which is included in the memory array region, are illustrated.

Isolation layers ISO are formed in an isolation region of the substrate 401. For example, the isolation layers ISO include a plurality of lines extending in a second direction (e.g., direction Y in FIG. 4) such that the lines are parallel to each other. Local lines SSL, WL and DSL extend in a first direction (e.g., direction X in FIG. 4) intersecting with the isolation layers ISO over the substrate 401. In an embodiment, the local lines include source selection lines SSL, word lines WL and drain selection lines DSL. Junction regions JC are formed in an active region of the substrate 401 between the local lines SSL, WL and DSL.

A source selection transistor is formed in a region where the active region of the substrate 401 and the source selection line SSL intersect with each other. A drain selection transistor is formed in a region where the active region of the substrate 401 and the drain selection line DSL intersect with each other. Memory cells are formed in a region where the active region of the substrate 401 and the word lines WL intersect with each other.

The local lines SSL, WL, and DSL may have a stacked structure including a tunnel insulation layer, a floating gate, a dielectric layer, and a control gate. In an embodiment, the selection lines SSL and DSL may be formed to have a width that is wider than a width of the word lines WL. The selection lines SSL and DSL may be spaced apart from each other at a distance further than a distance between two word lines WL.

Meanwhile, each of the memory blocks 110MBa may include a plurality of IO sectors IO1 and IO2, and a boundary region defined between the IO sectors IO1 and IO2. The junction region JC or an isolation layer may be formed at the boundary region of the semiconductor substrate 401.

While the memory blocks 110MBa are formed in the memory array region of the substrate 401, semiconductor devices corresponding to peripheral circuits (e.g., the circuits 120 to 140 in FIG. 1) may be formed in a peripheral circuit region of the substrate 401.

Figure 5:
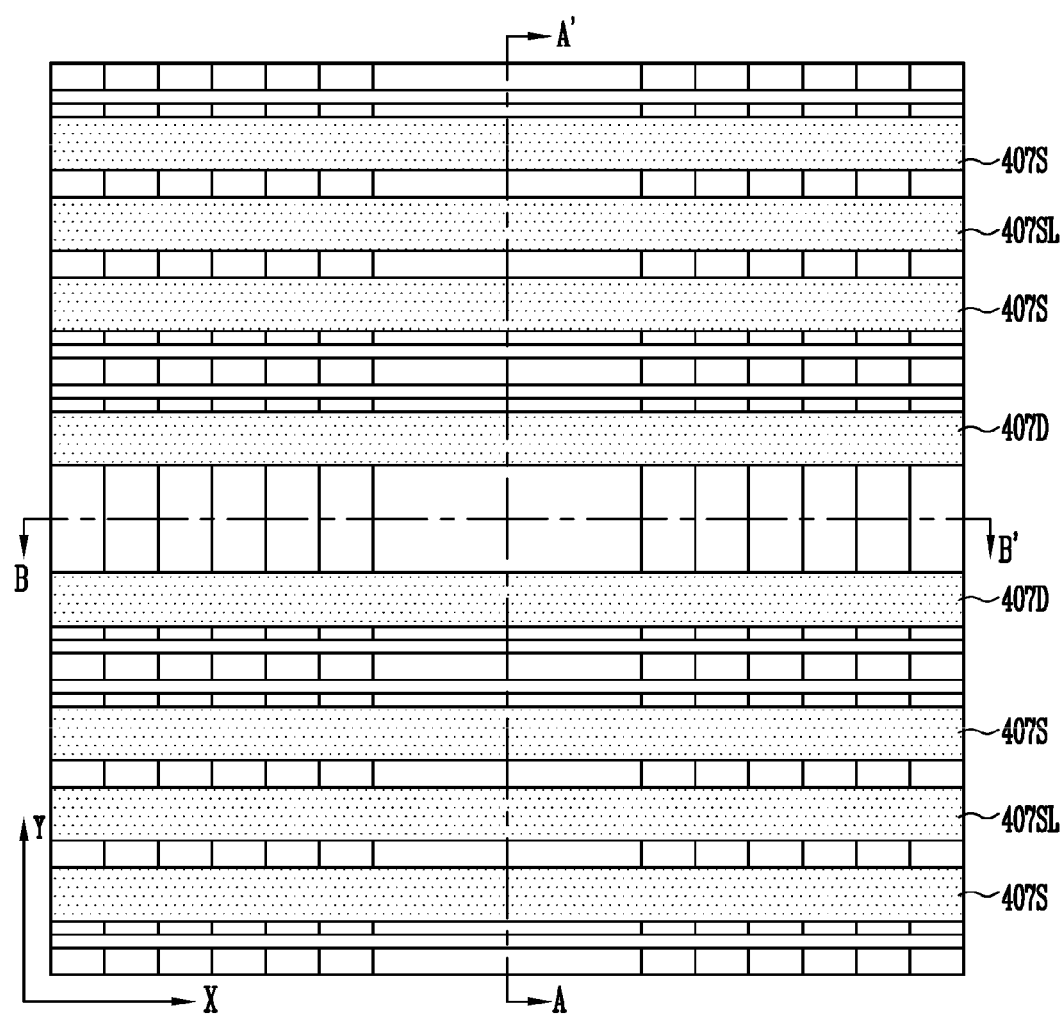
Figure 9A:
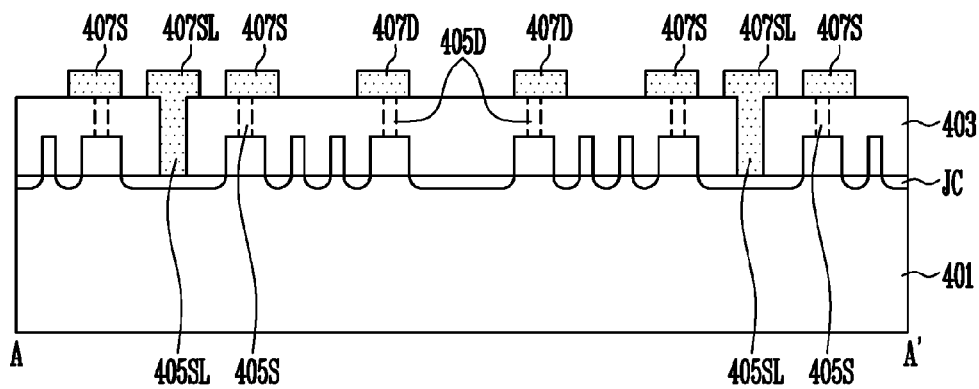
Figure 9B:
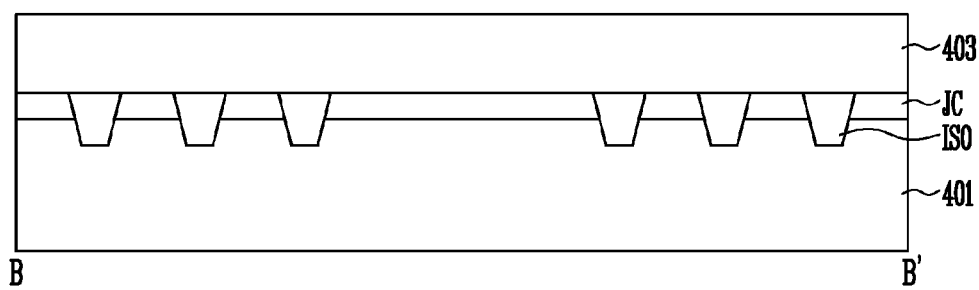

Referring now to FIGS. 5, 9A and 9B, a first interlayer insulation layer 403 is formed over the local lines SSL, WL, and DSL, the junction region JC, and the isolation layers ISO. Then, contact holes that expose the junction region JC (or a common source) between the source selection lines SSL are formed through the first interlayer insulation layer 403. For example, the contact holes have a line shape extending in a direction parallel to the source selection lines SSL and are formed between the source selection lines SSL. Meanwhile, other contact holes that expose top surfaces of the selection lines SSL and DSL may be formed through the first interlayer insulating layer 403.

After a first conductive layer has been formed over the first interlayer insulating layer 403 to fill the contact holes, the first conductive layer is patterned. As a result, contact plugs 405S, 405D and 405SL are formed in the contact holes, and the first conductive patterns 407S, 407D and 407SL are formed over the first interlayer insulating layer 403. The conductive patterns 407S and 407D (also referred to herein as selection line wires) coupled to the top surfaces of the selection lines SSL and DSL through the contact plugs 405S and 405D, are formed to reduce coupling resistance between the selection lines SSL and DSL and a switching circuit (e.g., the first and second switching circuits 1310a and 1310b in FIG. 2). In an embodiment, the conductive patterns 407SL (also referred to herein as first common source wires) coupled to the common source region JC between the source selection lines SSL through the contact plugs 405SL, may be a part of a common source line (e.g., the common source line SL in FIG. 3).

The first conductive patterns 407S, 407D and 407SL may have a line shape extending in a direction parallel to a first direction (e.g., direction X in FIG. 5).

In an embodiment, the contact plugs 405S, 405D and 405SL and the first conductive patterns 407S, 407D and 407SL may be formed by the same process in which the first conductive layer is formed. However, in another embodiment the first conductive patterns 407S, 407D and 407SL may be formed subsequent to formation of the contact plugs 405S, 405D and 405SL.

Since a first wiring layer includes the selection line wires 407S and 407D and the common source wire 407SL, the first conductive patterns 407S, 407D and 407SL may have wider widths and be disposed at greater intervals, as compared to when other wires are also formed in the first wiring layer. Accordingly, electrical characteristics and reliability of the semiconductor apparatus can be improved by reducing resistance values of the wires 407S, 407D, and 407SL, and also a risk of shorting between the wires 407S, 407D, and 407SL.

Figure 6:
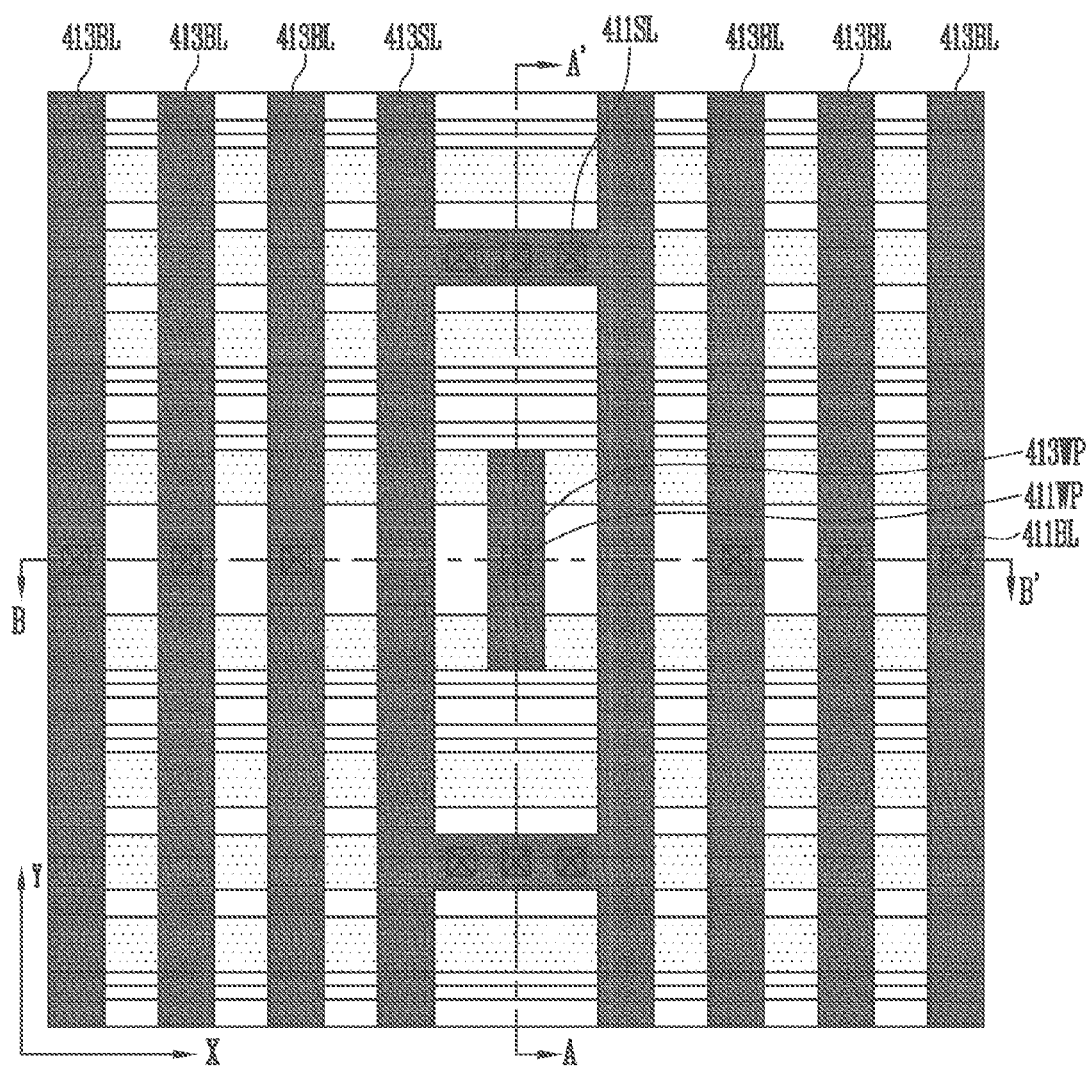
Figure 10A:
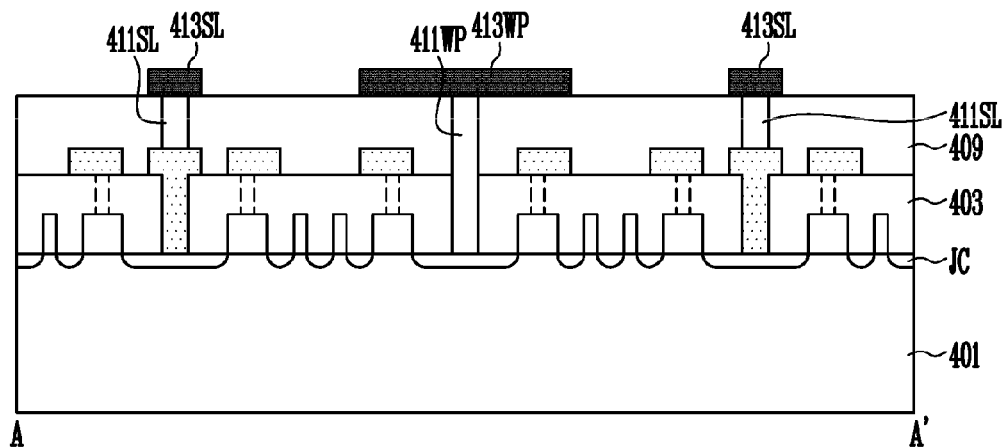
Figure 10B:
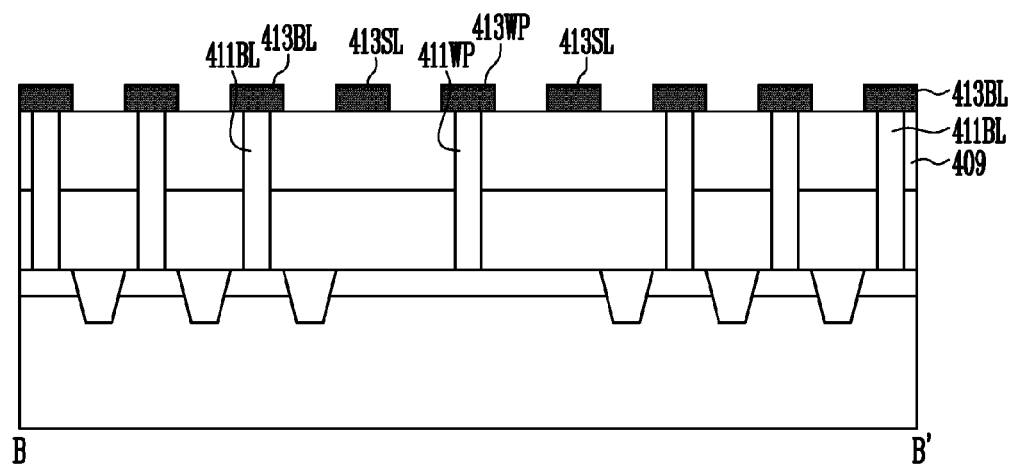

Referring to FIGS. 6, 10A and 10B, a second interlayer insulating layer 409 is formed over the first conductive patterns 407S, 407D, and 407SL. Then, contact holes are formed to expose the junction regions JC between the drain selection lines DSL through the second interlayer insulating layer 409 and the first interlayer insulating layer 403. In an embodiment, other contact holes that expose top surfaces of the first conductive patterns (or first common source wire) 407SL, and the contact holes that expose the junction regions JC of the boundary region, may be formed together.

After a second conductive layer has been formed over the second interlayer insulating layer 409 to fill the contact holes, the second conductive layer is patterned. Accordingly, contact plugs 411BL, 411SL and 411WP are formed in the contact holes, and the second conductive patterns 413BL, 413SL and 413WP are formed over the second interlayer insulating layer 409. The conductive patterns 413BL are used as bit line wires and coupled to the junction regions JC between the drain selection lines DSL through the contact plugs 411BL. The conductive patterns 413SL (second common source wires) are coupled to the conductive patterns 407SL (first common source wires) through the contact plugs 411SL to become a part of the common source line. The conductive patterns 413WP (first well pick up wires) are coupled to the junction region JC of the boundary region through the contact plug 411WP, and are used as a wire to transmit a bias applied to a well of the memory block.

In an embodiment, the contact plugs 411BL, 411SL and 411WP and the second conductive patterns 413BL, 413SL and 413WP may be formed during the same process by which the second conductive layer is formed. In another embodiment, the second conductive patterns 413BL, 413SL and 413WP may be formed in a subsequent process to a process during which the contact plugs 411BL, 411SL and 411WP are formed.

Accordingly, a second wiring layer includes the common source wires 413SL, the bit line wires 413BL, and the well pick-up wires 413WP. These second conductive patterns 413BL, 413SL, and 413WP may have a line shape extending in a direction parallel to the second direction (e.g., direction Y in FIG. 6) intersecting with the first direction (e.g., direction X in FIG. 6).

Figure 7:
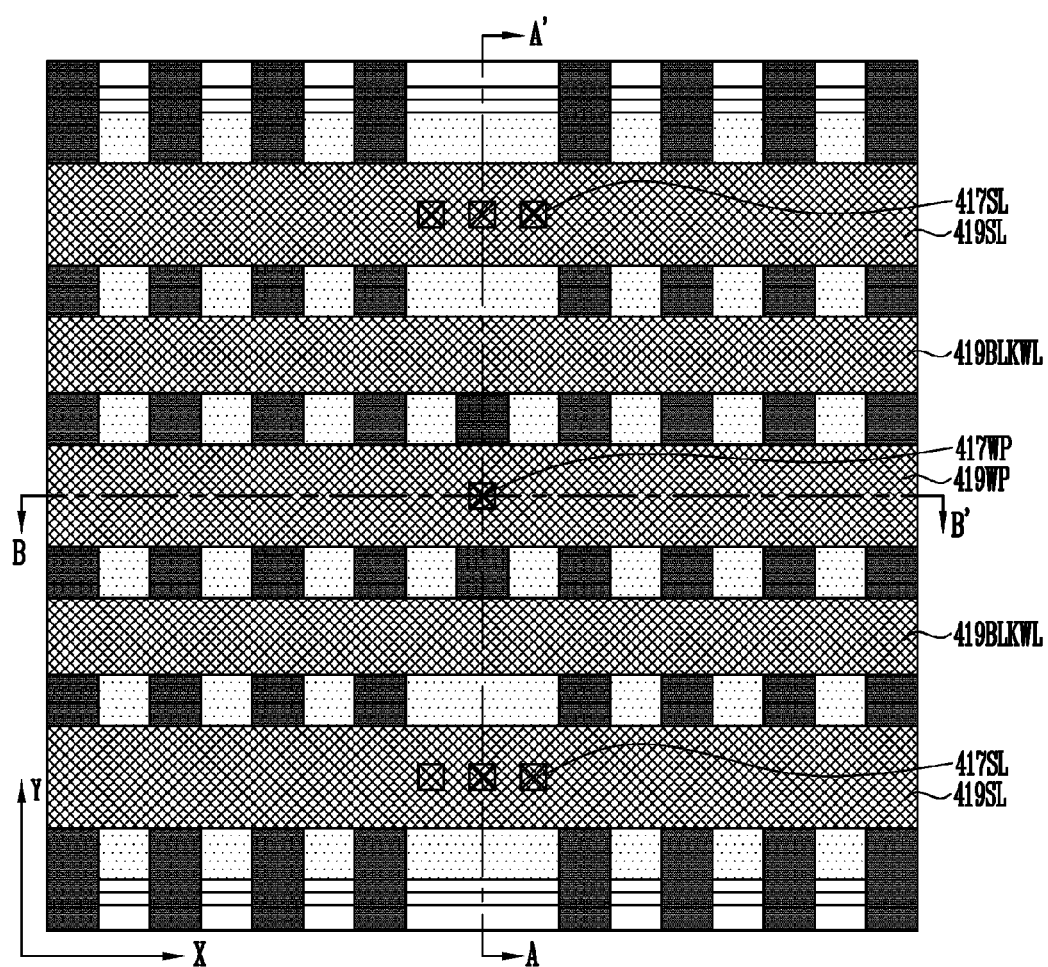
Figure 11A:
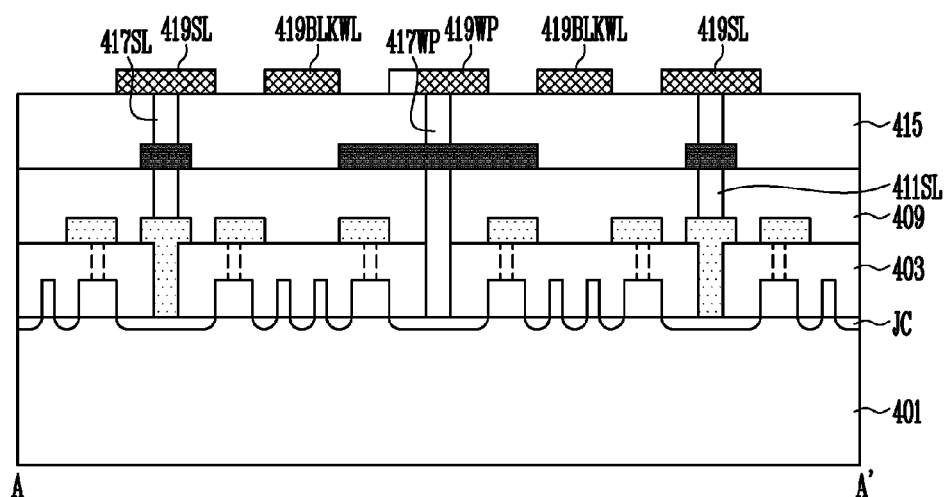
Figure 11B:
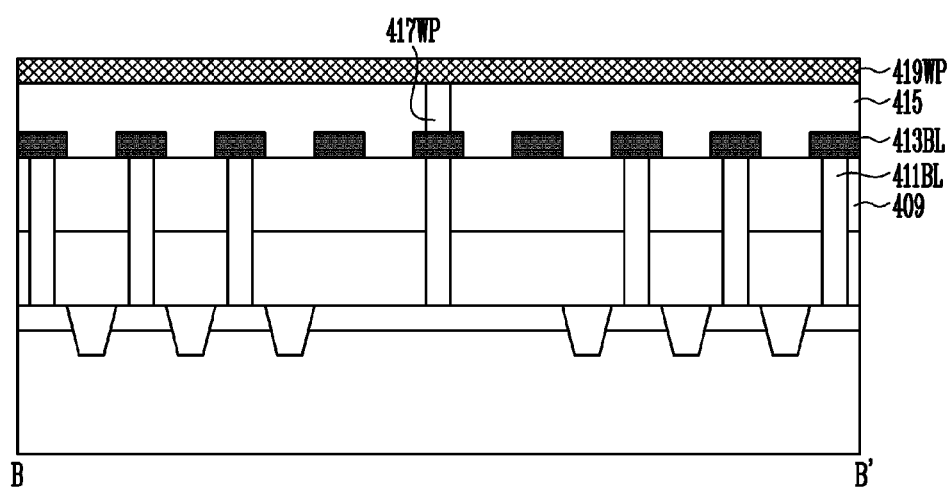

Referring to FIGS. 7, 11A and 11B, a third interlayer insulating layer 415 is formed over the second conductive patterns 413BL, 413SL and 413WP. And contact holes that expose top surfaces of the second conductive patterns 413SL (or the second common source wires) are formed through a third interlayer insulating layer 415. Here, other contact holes that expose top surfaces of the second conductive patterns 413WP (or the first well pick-up wires) may be formed through the third interlayer insulating layer 415 together with the contact holes exposing the top surfaces of the second conductive patterns 413SL.

After a third conductive layer is formed over the third interlayer insulating layer 415 to fill the contact holes, the third conductive layer is patterned. Accordingly, contact plugs 417SL and 417WP are formed in the contact holes, and third conductive patterns 419SL, 419WP and 419BLKWL are formed over the third interlayer insulating layer 415. Here, the conductive patterns 419SL are coupled to the conductive patterns 413SL (third common source wires) through the contact plugs 417SL to become a part of the common source line. The conductive patterns 419WP (second well pick-up wires) are coupled to the conductive patterns 413WP (the first well pick-up wires) through the contact plugs 417WP and are used as a wire to transmit a bias applied to the well of the memory block.

In particular, the conductive pattern 419BLKWL (block selection signal wire) serving as a wire to transmit the block selection signal BLKWLi is formed over the third interlayer insulating layer 415.

In an embodiment, the contact plugs 417SL and 417WP, and the third conductive patterns 419SL, 419WP, and 419BLKWL may be formed during the same process by which the third conductive layer is formed. However, in another embodiment, the third conductive patterns 419SL, 419WP, and 419BLKWL may be formed subsequent to formation of the contact plugs 417SL and 417WP.

Accordingly, a third wiring layer includes the third common source wires 419SL, the second well pick-up wires 419WP, and the first block selection signal wires 419BLKWL. Such third conductive patterns 419SL, 419WP and 419BLKWL may have a line shape extending in a direction parallel to the first direction (e.g., direction X in FIG. 7).

As shown in the above structure, since the block selection signal wires 419BLKWL are formed over the bit line wires 413BL, the space for forming the selection line wires 407S and 407D and the common source wires 407SL under the bit line wires 413BL, increases. As a result of enlarging the widths and/or intervals between the selection line wires 407S and 407D and the common source wires 407SL, resistance values of these wires 407S, 407D and 407SL can be reduced. A risk of shorting between the wires 407S, 407D and 407SL can also be reduced.

FIGS. 12 to 15 are planar views illustrating a semiconductor apparatus according to another embodiment. FIGS. 16A, 16B, 17A, 17B, 18A, 18B, 19A and 19B are cross-sectional views illustrating the semiconductor apparatus and methods of manufacturing the same according to the embodiment shown in FIGS. 12 to 15.

Figure 12:
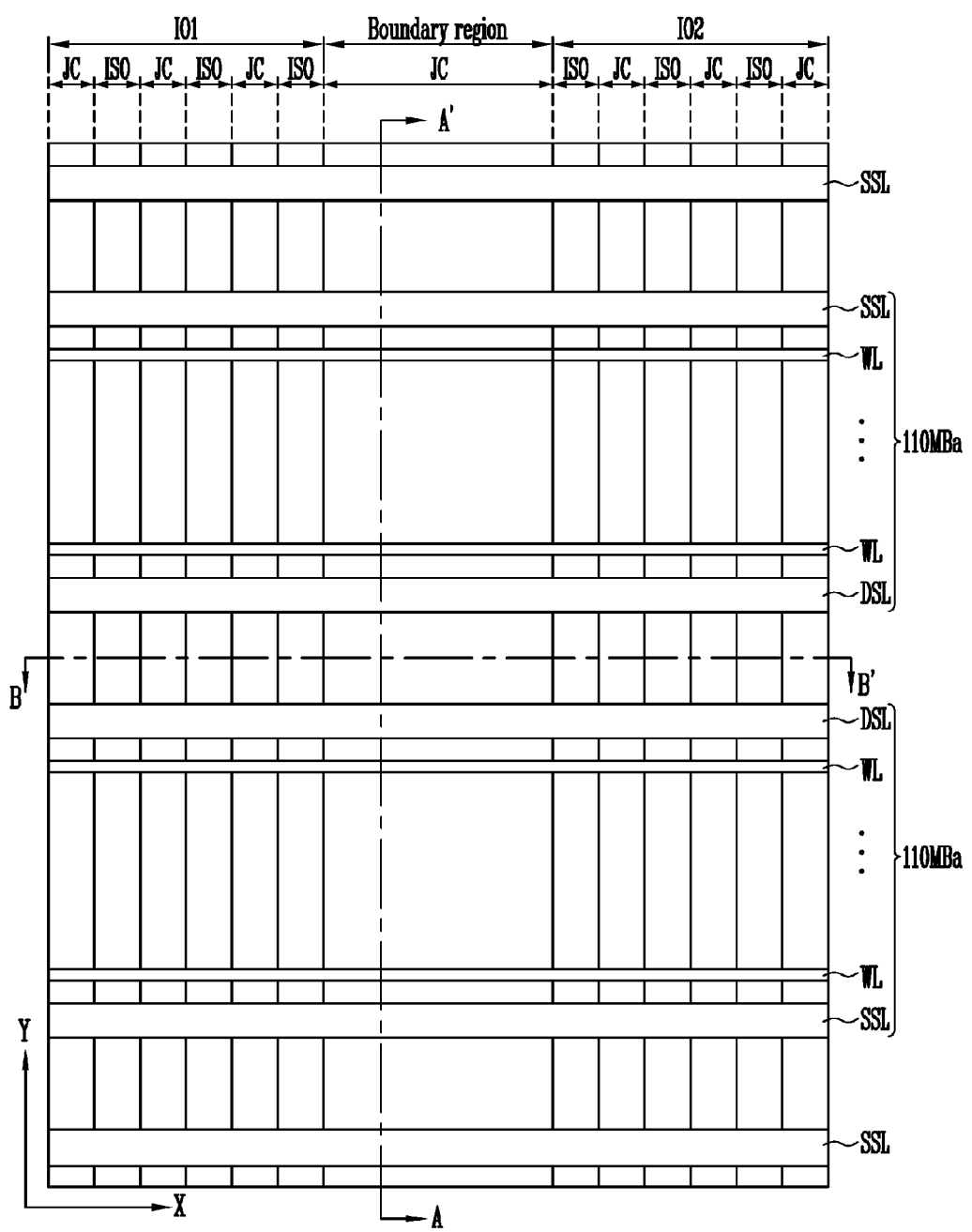
FIGS. 12 to 15 are planar views illustrating a semiconductor apparatus according to another embodiment.
Figure 16A:
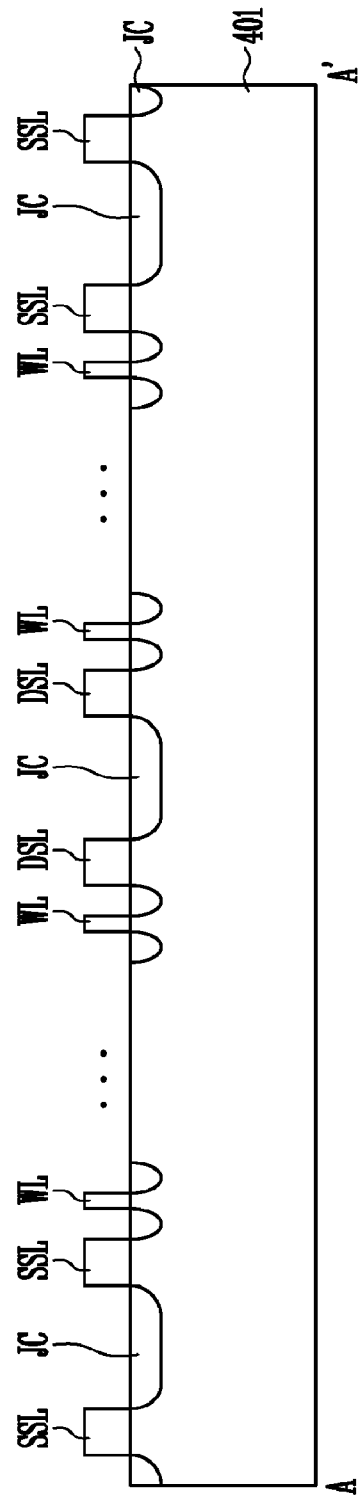
Figure 16B:
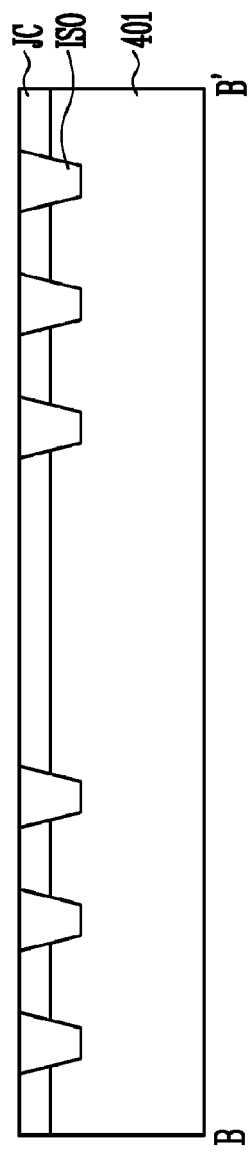

Referring to FIGS. 12, 16A and 16B, the memory blocks 110MBa are formed in the memory array region of the semiconductor substrate 401. The memory blocks 110MBa may be formed in substantially a same manner as described above with reference to FIGS. 4, 8A and 8B.

Figure 13:
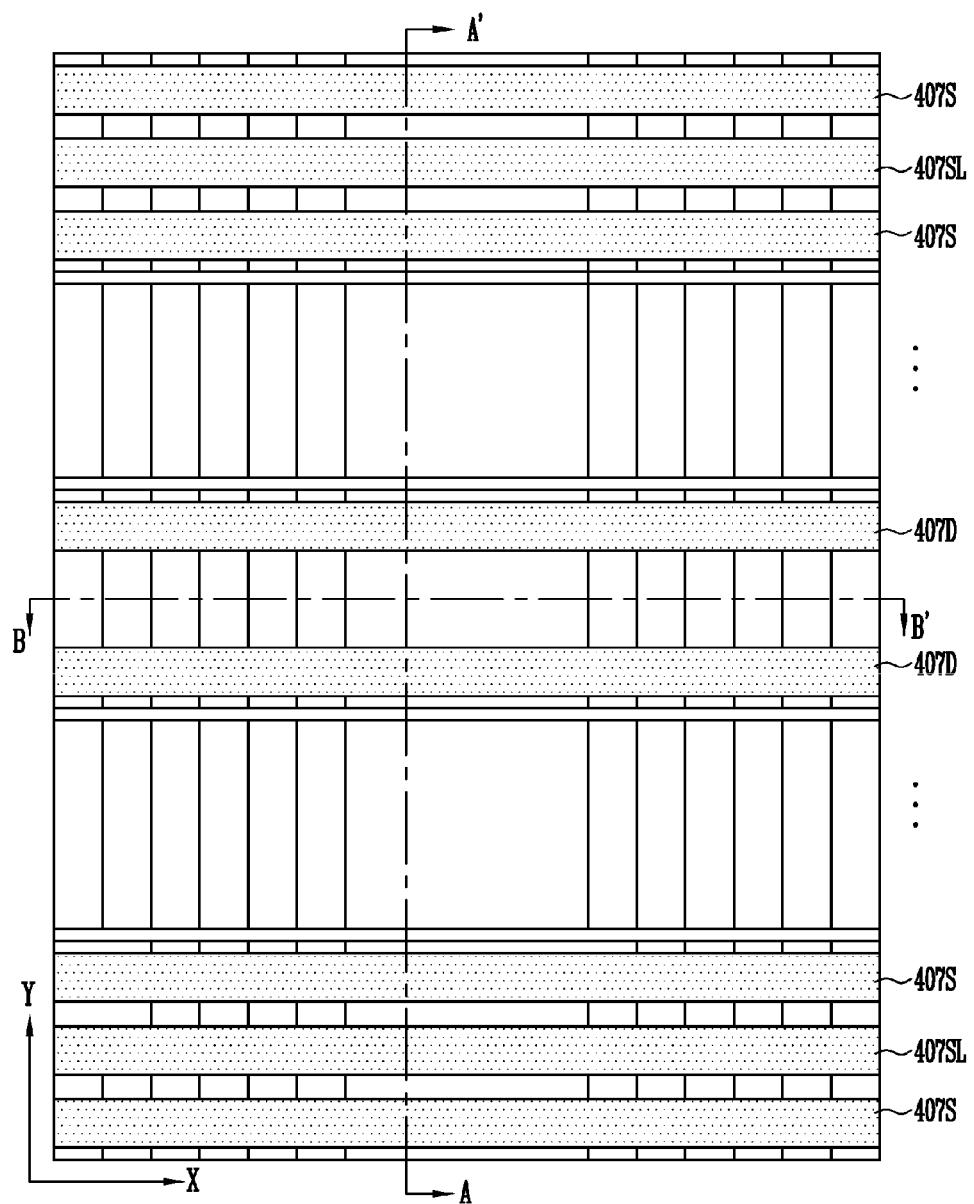
Figure 17A:
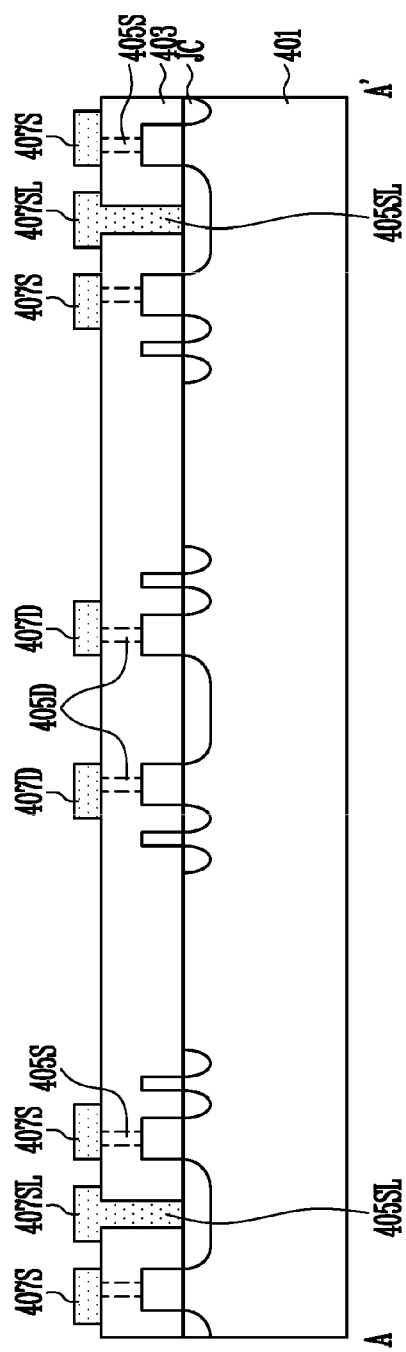
Figure 17B:
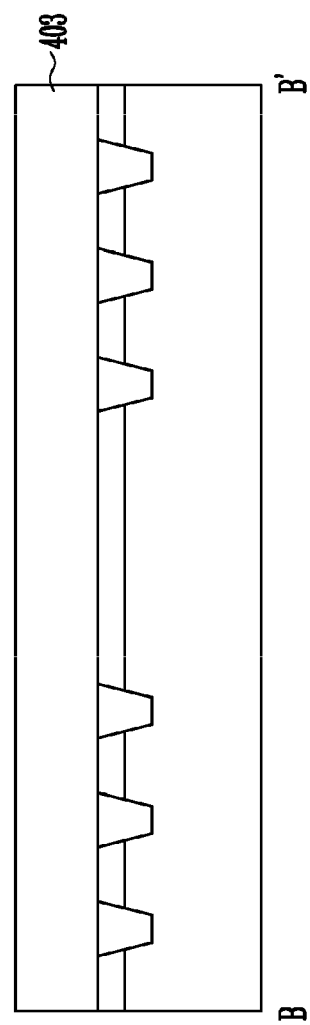

Referring to FIGS. 13, 17A and 17B, first interlayer insulating layer 403 is formed over local lines SSL, WL, and DSL, the junction regions JC, and the isolation layers ISO. Then, contact holes that expose the junction region JC (the common source) between the source selection lines SSL (see FIG. 12) are formed through the first interlayer insulation layer 403. Other contact holes that expose top surfaces of the selection lines SSL and DSL may be formed through the first interlayer insulating layer 403. Thereafter, the contact plugs 405S, 405D, and 405SL are formed in the contact holes, and the first conductive patterns 407S, 407D, and 407SL are formed over the first interlayer insulating layer 403. The contact plugs 405S, 405D, and 405SL and the first conductive patterns 407S, 407D, and 407SL may be formed in substantially a same manner as described above with reference to FIGS. 5, 9A and 9B.

Figure 14:
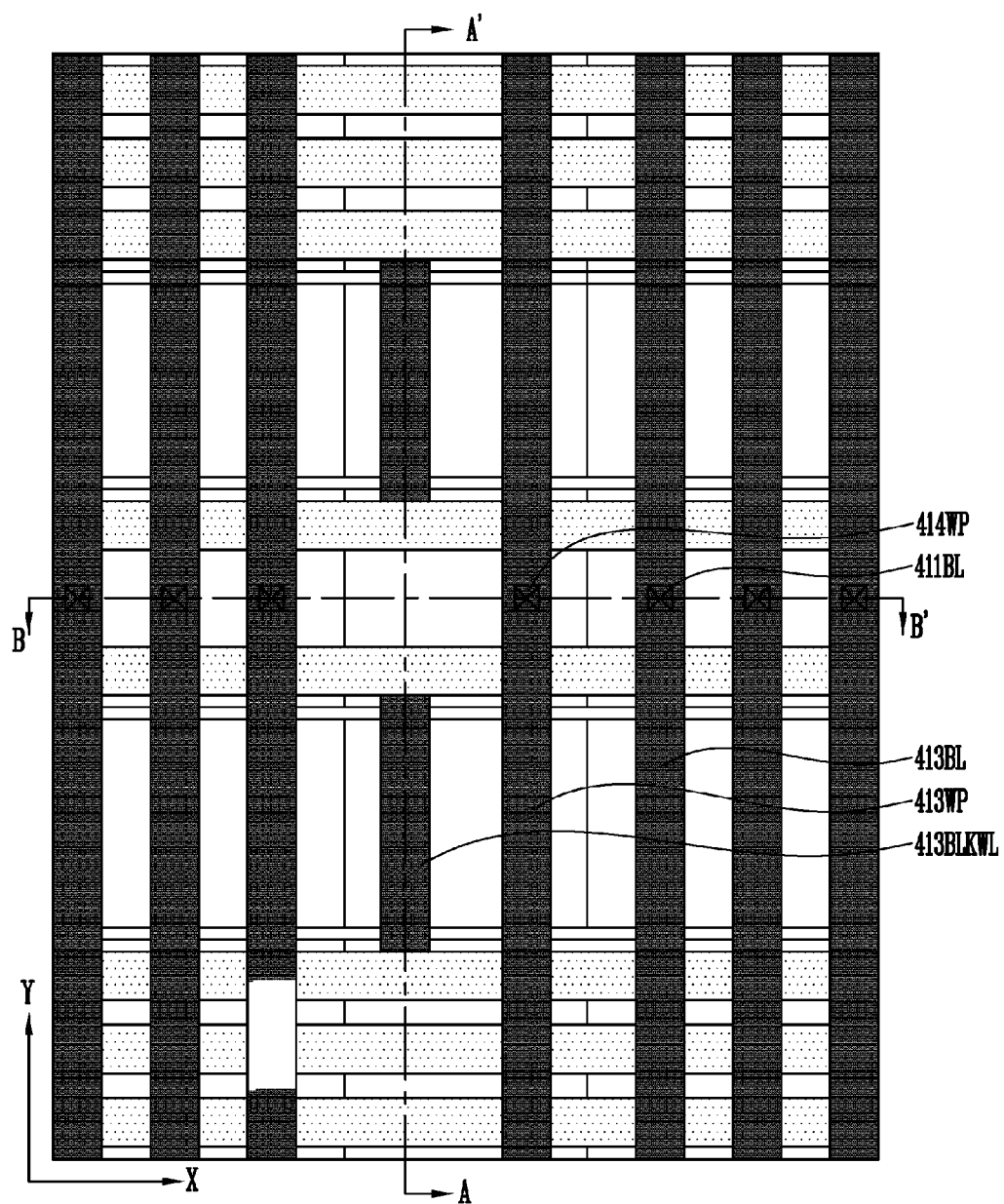
Figure 18A:
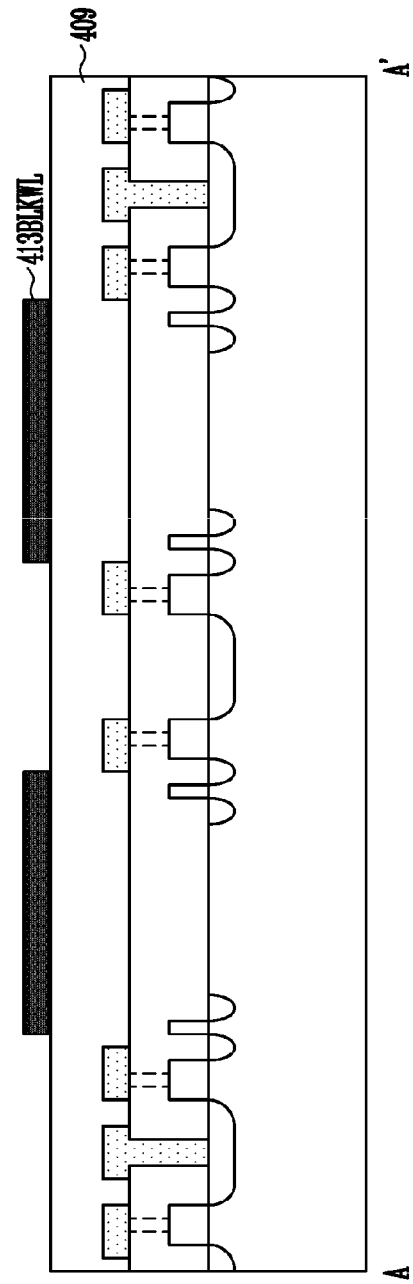
Figure 18B:
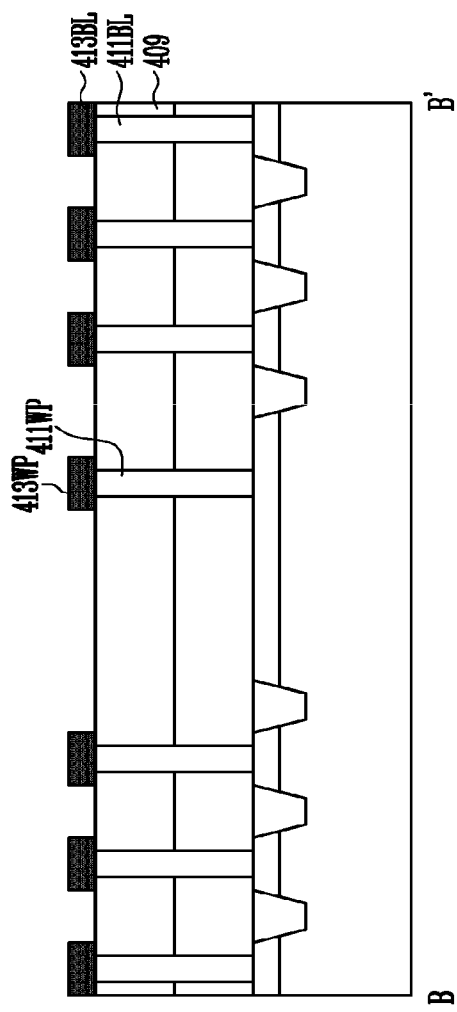

Referring to FIGS. 14, 18A and 18B, second interlayer insulating layer 409 is formed over the first conductive patterns 407S, 407D and 407SL, and the first interlayer insulating layer 403. And contact holes that expose the junction regions JC between the drain selection lines DSL (see FIG. 12) are formed through the second interlayer insulating layer 409 and the first interlayer insulating layer 403. Other contact holes that expose the junction regions JC of the boundary region may be formed together. The contact holes that expose the junction region JC between the drain selection lines DSL at the boundary region may be formed together.

After a second conductive layer has been formed over the second interlayer insulating layer 409 to fill the contact holes, the second conductive layer is patterned. Accordingly, the contact plugs 411BL and 411WP are formed in the contact holes, and the second conductive patterns 413BL, 413WP, and 413BLKWL are formed over the second interlayer insulating layer 409. For example, the conductive patterns 413BL (bit line wires) serving as bit lines is coupled to the junction regions JC between the drain selection lines DSL in the IO sectors IO1 and IO2 (see FIG. 12) through the contact plugs 411BL. The conductive pattern 413WP (well pick-up wire) is coupled to the junction region JC of the boundary region through the contact plug 411WP and is used as a wire to transmit a bias applied to the well of the memory block.

Meanwhile, conductive pattern 413BLKWL (second block selection signal wire) may be further formed over the second interlayer insulating layer 409 which will be described further below.

In an embodiment, the contact plugs 411BL and 411WP, and the second conductive patterns 413BL, 413WP, and 413BLKWL may be formed during the same process by which the second conductive layer is formed. However, in another embodiment, the second conductive patterns 413BL, 413WP, and 413BLKWL may be formed subsequent to formation of the contact plugs 411BL and 411WP.

A second wiring layer includes the bit line wires 413BL, the well pick-up wires 413WP, and the second block selection signal wires 413BLKWL. These second conductive patterns 413BL, 413WP, and 413BLKWL may have a line shape extending in a direction parallel to the second direction (e.g., direction Y in FIG. 14) intersecting with the first direction (e.g., direction X in FIG. 14).

Figure 15:
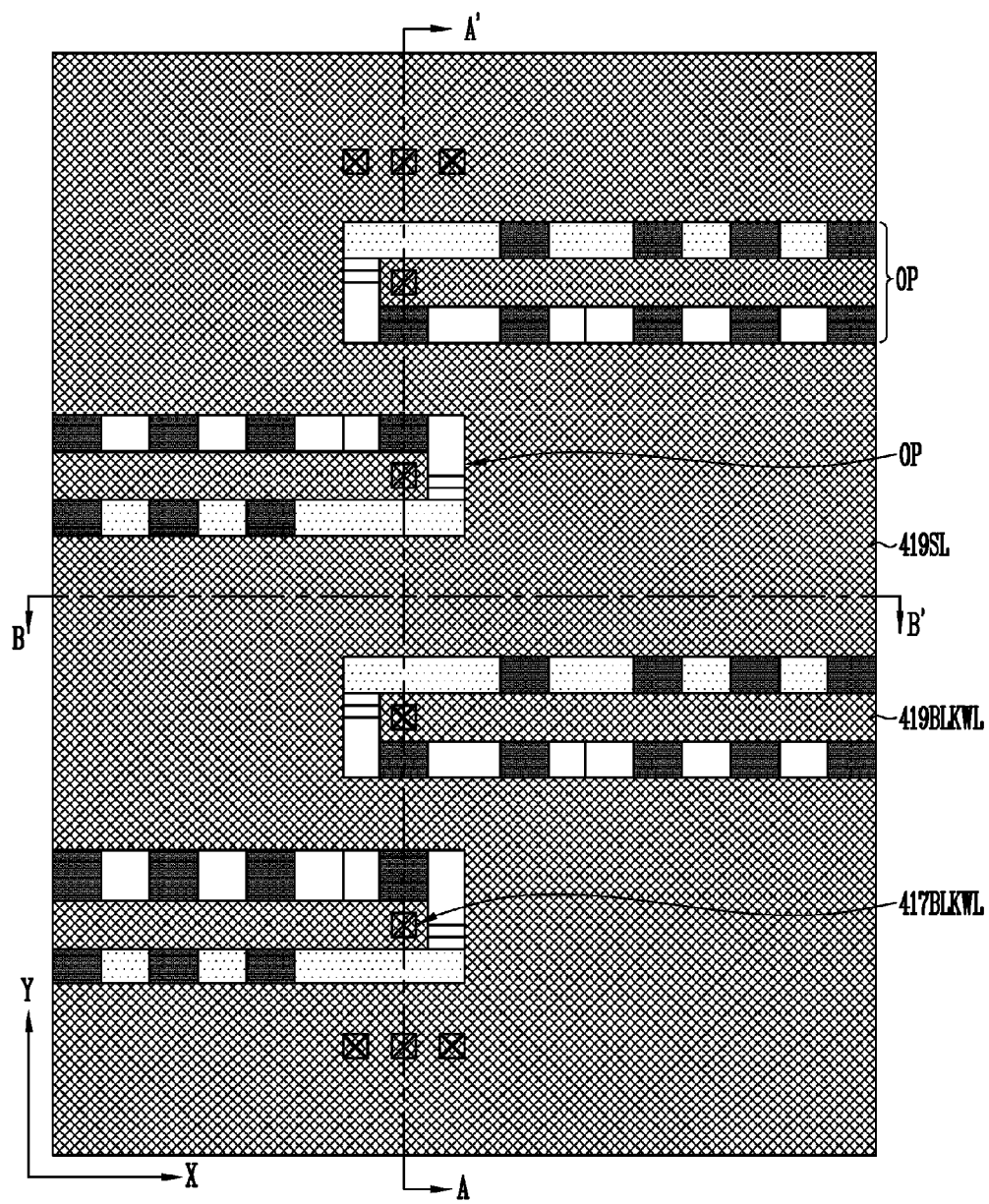

Referring to FIGS. 15, 19A, and 19B, third interlayer insulating layer 415 is formed over the second conductive patterns 413BL, 413WP and 413BLKWL. And contact holes that expose upper surfaces of the first conductive patterns 407SL (first common source wires) are formed through the third interlayer insulating layer 415 and second interlayer insulating layer 409. Other contact holes that expose upper surfaces of the second conductive patterns 413BLKWL (second block selection signal wires) are formed together with the contact holes exposing the upper surfaces of the first conductive patterns 407SL through the third interlayer insulating layer 415.

After a third conductive layer is formed over the third interlayer insulating layer 415 to fill the contact holes, the third conductive layer is patterned. Accordingly, contact plugs 417SL and 417BLKWL are formed in the contact holes, and third conductive patterns 419SL and 419BLKWL are formed over the third interlayer insulating layer 415. Here, the conductive patterns 419SL (third common source wires) are coupled to the conductive patterns 407SL (first common source wires) through the contact plugs 417SL and become a part of the common source line.

In particular, the conductive patterns 419SL are formed over the memory block 110MBa except openings OP that have a line shape extending in the first direction (e.g., direction X in FIG. 15). In an embodiment, the openings OP are arranged in a zigzag pattern. Specifically, the openings OP are arranged along the second direction (e.g., direction Y in FIG. 15) such that every two openings OP are substantially identical to each other and two subsequent openings OP extend in opposite directions to each other. The conductive patterns 419BLKWL (first block selection signal wires) are arranged in the openings OP. The conductive patterns 419BLKWL (first block selection signal wires) are coupled to the conductive patterns 413BLKWL (second block selection signal wires) through the contact plugs 417BLKWL so that the conductive patterns 413BLKWL couple the conductive patterns 419BLKWL arranged in different openings OP.

In an embodiment, the contact plugs 417SL and 417BLKWL and the third conductive patterns 419SL and 419BLKWL, may be formed during the same process by which the third conductive layer is formed. However, in another embodiment, the third conductive patterns 419SL and 419BLKWL may be formed subsequent process to formation of the contact plugs 417SL and 417BLKWL.

Accordingly, a third wiring layer includes the third common source wires 419SL and the first block selection signal wires 419BLKWL. The first block selection signal wires 419BLKWL may have a line shape extending in a direction parallel to the first direction (e.g., direction X in FIG. 15).

As shown in the above structure, since the first block selection signal wires 419BLKWL are formed over the bit line wires 413BL, the space for forming the selection line wires 407S and 407D and the first common source wires 407SL under the bit line wires 413BL increases. As a result, of enlarging widths and/or intervals between the selection line wires 407S and 407D and the first common source wires 407SL, resistance values of the wires 407S, 407D, and 407SL can be reduced, and a risk of shorting between the wires 407S, 407D, and 407SL can be also reduced.

Also, since the third common source wire 419SL is formed in a large area, the resistance of the third common source wire 419SL can also be reduced. As a result, a source bouncing line phenomenon, (due to resistance components existing in a source line), may be prevented and the electrical characteristics may be further improved.

In summary, a semiconductor apparatus capable of improving electrical characteristics and reliability of the apparatus is provided and supported by the above-described embodiments.

Embodiments disclosed herein, although specific terms are employed, are used and are to be interpreted in a generic and descriptive sense and not for purpose of limitation. In some instances, features, characteristics, and/or elements described in connection with a particular embodiment may be used alone or in combination with features, characteristics, and/or elements described in connection with other embodiments, unless otherwise specifically indicated. Accordingly, it will be understood by those of skill in the art that various changes in form and details may be made without departing from the spirit and scope of the present disclosure as set forth in the following claims.

What is claimed is:

1. A semiconductor device, comprising:
   first conductive patterns comprising first common source wires and first selection line wires formed over a substrate, the first common source wires being coupled to a common source, and the first selection line wires being coupled to selection lines of a memory block;
   second conductive patterns comprising bit line wires coupled to the memory block; and
   third conductive patterns comprising first block selection signal wires configured to transmit a block selection signal to cause a switching circuit to couple local lines of the memory block to global lines,
   wherein the first to third conductive patterns are formed in different layers over the memory block.

2. The semiconductor device according to claim 1, wherein the second conductive patterns further comprise second common source wires coupled to the first common source wires.

3. The semiconductor device of claim 2, wherein the third conductive patterns further comprise third common source wires coupled to the second common source wires.

4. The semiconductor device of claim 1, wherein the second conductive patterns further comprise first well pick-up wires configured to transmit a bias applied to a well of the memory block.

5. The semiconductor device of claim 1, wherein the third conductive patterns further comprise second well pick-up wires configured to transmit a bias applied to a well of the memory block.

6. The semiconductor device of claim 1, wherein the third conductive patterns further comprise third common source wires coupled to the first common source wires.

7. The semiconductor device of claim 6, wherein the third common source wires are formed over the memory block except for openings arranged in a zigzag pattern.

8. The semiconductor device of claim 7, wherein the first block selection signal wires are disposed in the openings.

9. The semiconductor device of claim 8, wherein the second conductive patterns further comprise second block selection signal wires configured to couple the first block selection signal wires located in different openings.

10. The semiconductor device of claim 1, wherein the first to third conductive patterns intersect with each other.

11. A semiconductor device, comprising:
first and second memory blocks arranged in a first direction;
a first switching circuit located on a first side of the first memory block and configured to couple first local lines of the first memory block to first global lines in response to a block selection signal, and a second switching circuit located on a second side of the second memory block and configured to couple second local lines of the second memory block to second global lines in response to the block selection signal, the second side of the second memory block being opposite to the first side of the first memory block;
a first read/write circuit coupled to the first memory block through first bit lines, and a second read/write circuit coupled to the second memory block through second bit lines;
a row decoder configured to generate the block selection signal, and to apply the block selection signal to the first and second switching circuits;
a first block selection signal wire configured to transmit the block selection signal, and arranged over the first and second bit lines;
a first common source wire coupled to a common source of the first memory block; and
selection line wires coupled to selection lines of the first memory block,
wherein the first common source wire and the selection line wires are arranged under the first bit lines.

12. The semiconductor device of claim 11, further comprising a first well pick-up wire configured to transmit a bias applied to a well of the first memory block, wherein the first well pick-up wire is parallel to the first bit lines.

13. The semiconductor device of claim 12, further comprising a second well pick-up wire configured to transmit a bias applied to a well of the first memory block, wherein the second well pick-up wire is parallel to the first block selection signal wire.

14. The semiconductor device of claim 11, further comprising a second common source wire coupled to the first common source wire and extending in a direction parallel to the first bit lines.

15. The semiconductor device of claim 14, further comprising a third common source wire coupled to the second common source wire, wherein the third common source wire is parallel to the first block selection signal wire.

16. The semiconductor device of claim 11, further comprising a third common source wire arranged in a layer where the first block selection signal wire is provided, the third common source wire being coupled to the first common source wire.

17. The semiconductor device of claim 16, wherein the third common source wire is formed over the memory block except for openings having a line shape and being arranged in a zigzag pattern over the first memory block.

18. The semiconductor device of claim 17, wherein the first block selection signal wire is disposed in one of the openings.

19. The semiconductor device of claim 18, further comprising a second block selection signal wire and a plurality of block selection signal wires,
wherein the second block selection signal wire is arranged in the layer where the first block selection signal wire is provided, and the second block selection signal wire is disposed in another one of the openings that is different from the opening in which the first block selection signal wire is disposed, and
wherein the plurality of block selection signal wires are arranged in a layer where the first bit lines are provided and parallel to the first bit lines, each of the plurality of block selection signal wires configured to couple the first block selection signal wire and the second block selection signal wire.

* * * * *